(12) United States Patent
Kato et al.

(10) Patent No.: US 6,284,658 B1
(45) Date of Patent: Sep. 4, 2001

(54) MANUFACTURING PROCESS FOR SEMICONDUCTOR WAFER

(75) Inventors: Tadahiro Kato; Sadayuki Okuni, both of Nishishirakawa-gun; Keiichi Okabe, Kosyoku; Hisashi Oshima, Nakakubiki-gun, all of (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/348,276

(22) Filed: Jul. 7, 1999

(30) Foreign Application Priority Data

Jul. 8, 1998 (JP) ................................................ 10-192555

(51) Int. Cl.$^7$ .................................................. H01L 21/302
(52) U.S. Cl. ........................... 438/690; 438/691; 438/692
(58) Field of Search ..................................... 438/690, 691, 438/692, 693, 697

(56) References Cited

U.S. PATENT DOCUMENTS

| 4,144,099 | | 3/1979 | Edmonds et al. | |
|---|---|---|---|---|
| 5,756,399 | * | 5/1998 | Hajime et al. | 438/692 |
| 5,800,725 | * | 9/1998 | Kato et al. | 438/692 |
| 5,904,568 | * | 5/1999 | Maeda et al. | 438/690 |

FOREIGN PATENT DOCUMENTS

| 0798405A2 | * | 3/1997 | (EP) . |
| 798 405 | | 10/1997 | (EP) . |
| 813 931 | | 12/1997 | (EP) . |
| 8-66850 | | 3/1996 | (JP) . |
| 9-260314 | | 10/1997 | (JP) . |

OTHER PUBLICATIONS

Patent Abstracts of Japan, vol. 1996, No. 6, Abstract of JP 8-37169.
Patent Abstracts of Japan, vol. 12, No. 318, Abstract of JP 63-81934.

* cited by examiner

*Primary Examiner*—David Nelms
*Assistant Examiner*—Dung A Le
(74) *Attorney, Agent, or Firm*—Crowell & Moring LLP

(57) ABSTRACT

The present invention has an object to provide a manufacturing process of a semiconductor wafer in which improvement on accuracy in a chamfering portion is realized. The manufacturing process of a semiconductor wafer comprises: a slicing step of obtaining a wafer in the shaped of a thin disk by slicing a single crystal ingot; a surface-grinding step of flattening a surface of the wafer; a chamfering step of chamfering the peripheral edge portions; and mirror-polishing step of mirror-polishing the surface of the wafer, wherein a simultaneous double-side surface-grinding step of grinding both sides of the wafer simultaneously by a double-side grinding machine is existent prior to the chamfering step in order to remove wafer waviness and a secondary grinding step is performed by grinding a single side or simultaneously both sides of the wafer after the chamfering step is carried out, so that improvement on accuracy in a chamfered portion is realized.

4 Claims, 7 Drawing Sheets

FIG. 4

| | Quality of chamfered portion | Wafer waviness |
|---|---|---|
| Example 1 | ◎ | ◎ |
| Example 2 | ◎ | ◎ |
| Comparative example 1 | △ | ◎ |
| Comparative example 2 | △ | ○ or △ |
| Comparative example 3 | △ | × |

US 6,284,658 B1

MANUFACTURING PROCESS FOR SEMICONDUCTOR WAFER

BACKGROUND OF THE INVENTION

1. Field of the Invention

The present invention relates to a manufacturing process for a semiconductor wafer and more particularly, to a manufacturing process for a silicon single crystal wafer.

2. Description of the Prior Art

Conventionally, a manufacturing process for a semiconductor wafer, as shown in FIG. 5, has in general comprised: a slicing step E of obtaining a wafer in the shape of a thin disk by slicing a single crystal ingot which has been pulled in a single crystal pulling apparatus; a chamfering step F of chamfering peripheral edge portions of the wafer in order to prevent the sliced wafer from chipping or breaking; a lapping step L of flattening the surfaces of the chamfered wafer; a wet etching step H of removing a damaged layer remained after the chamfering and lapping steps; a mirror-polishing step K of mirror-polishing a surface of the etched wafer; and the like. While the process has sometimes been added with one or more of a various kinds of cleaning steps and value-adding steps between the above described steps, the process has fundamentally followed the above described flow.

In JP 96-66850 A (Hei 8), a technique is disclosed in which processing of a wafer is carried out in the order of a slicing step, a surface-grinding step, a chamfering step and a mirror-polishing step.

In recent years, as a planarization step, processing has also been employed in which a wafer is flattened to high accuracy by a grinding step, instead of the lapping step L, which employs a surface-grinding machine or a simultaneous double-side surface-grinding machine with the result that the ground wafer is made free of thickness variation and waviness.

As the surface grinding machine, an infeed type surface-grinding machine has generally been known in which a wafer is supported on a chuck table rotating at a high speed and a cup-shaped grinding stone (grinding wheel) is continuously fed into the wafer at a rate so as to be surface-ground.

As the simultaneous double-side surface-grinding machine, there have been known the following two machines and the like: a single wafer type double-side surface-grinding machine in which a plurality of as-cut wafers loaded on a carrier driven at a low speed in an opposed direction of that of upper and lower grinding stones driven at a high speed are sequentially supplied into between the upper grinding stone and lower grinding stone so as to be processed, and a batch type double-side grinding machine in which the upper and lower grinding stones are respectively mounted on the upper and lower tables, a plurality of wafers are inserted between the upper and lower grinding stones, being caged in wafer receive holes formed in a carrier, and both sides of each of the plurality of wafers are simultaneously ground by rotation of the lower table under pressure from the upper table (see JP 97-260314 A).

As the slicing step, a technique in which a wafer in the shape of a thin disk is obtained by slicing with a wire saw or a circular inner diameter blade has generally been adopted. Minute thickness variations and waviness in company with reciprocating movements of a wire saw are produced or inscribed on a surface of a wafer which is sliced by the wire saw. In the case of slicing with a circular inner diameter blade, levels of thickness variations and waviness are lower than those in the case of a wire saw, whereas since the blade is not suitable for slicing a larger diameter wafer, the blade is exclusively used in slicing to obtain small diameter wafers.

When a sliced wafer which has thickness variations and waviness as described above, that is having a problem in accuracy of thickness, is subjected to the chamfering step, there has arisen a problem of variations in width of a chamfered portion, as will be described below.

That is, when a wafer is chamfered along its edge portions in such a manner that a wafer 1 supported on a grinding stage 2 is pressed, while rotating at a low speed, to a grinding stone 3 rotating at a high speed as shown in FIG. 6, presence of thickness variations of the wafer 1 is in turn resulted in variations in width X of a chamfered portion thereof.

This will be described in a concrete manner. When, in section, an angle between a major surface of the wafer and a chamfered portion 4 is denoted as θ, a chamfer width as X and a chamfer height as Y, an equation $X=Y(\tan \theta)^{-1}$ is established. In the case of a wafer (indicated by a chain line) with a larger thickness than a standard wafer (indicated by a solid line) 1, a chamfer width is larger to be X1 if a load in chamfering is same. On the other hand, in the case of a wafer with a smaller thickness than the standard wafer, a chamfer width is smaller. In chamfering with the angle θ of 22 degrees, which is general, a thickness variation of 10 μm entails a variation in chamfer width of about 25 μm.

When there is variations in chamfer width beyond a level, devices are hard to be fabricated in the peripheral region of a wafer to a full extent all the time, which has progressively increased a demand for improvement on a processing quality of a chamfer of wafer in recent years.

In a conventional method shown in FIG. 5, however, since a lapping step is included thereby, a chamfering step F is forced to be carried out prior to the lapping step L, that is, directly after a slicing step E. Hence, occurrence of variations in chamfer width has not been avoided as described above, since chamfering has to be conducted on a wafer which still has a larger thickness variation.

FIGS. 7(A), (B) show histograms in each of which the abscissa is used for plotting the values of an accuracy in chamfer width (a chamfer width aberration) and the ordinate is assigned to a relative frequency; FIG. 7(A) shows the values of a theoretical accuracy calculated from an accuracy of a chamfer machine and FIG. 7(B) shows measurement results of the states of variation in chamfer width in a conventional chamfering step. Incidentally, the evaluation of an accuracy in chamfer width was carried out by measurement with an edge profiler (made by Hamamatsu Photonics Co.) which is an image processing apparatus for a projected image. The abscissa is scale-marked, for example, with "0" thereon at a chamfer width accuracy in the range of −15 μm to +15 μm. The conventional method is inferior in accuracy of chamfer width as clearly seen from the graphs.

In a method adopting a planarization step by means of a surface-grinding machine, a step different from the conventional step of FIG. 5 can be adopted and a process flow corresponding to this has also been proposed. Any of conventional process flows has, however, been developed with attentions focused on productivity and high flatness and thus deep consideration has not been given on a quality of chamfered portion in the process flows.

SUMMARY OF THE INVENTION

The present invention has been made taking the above described problematic points into consideration and it is accordingly an object of the present invention to provide a manufacturing process for a semiconductor wafer in which a chamfering step is effected after at least one run of simultaneous double-side surface-grinding and an etching step is not employed, and which makes improvement on accuracy in a chamfered portion realized.

In order to achieve such an object, the present invention is directed to a manufacturing process of a semiconductor wafer comprising: a slicing step of obtaining a wafer in the shape of a thin disk by slicing a single crystal ingot; a surface-grinding step of flattening a surface of the wafer; a chamfering step of chamfering the peripheral edge portions of the wafer; and a mirror-polishing step of mirror-polishing the surface of the wafer, wherein a simultaneous double-side surface-grinding step of grinding both sides of the wafer simultaneously by means of a double-side grinding machine is existent prior to the chamfering step; and a secondary grinding step is performed by single-side grinding as represented by infeed grinding using a cup shaped grinding stone or the like after the chamfering step is carried out.

While it is indispensable that a chamfering step is effected after a simultaneous double-side surface-grinding step, preliminary chamfering can be effected, if necessary, in order to remove burrs and stabilize an outer diameter prior to the simultaneous double-side surface-grinding step.

In addition, it is also possible that a simultaneous double-side surface-grinding step of grinding both sides of a wafer simultaneously by means of a double-side grinding machine is adopted as a primary grinding step and a secondary grinding step can be performed by the simultaneous double-side polishing with a finish grinding stone after the chamfering step is carried out following the primary grinding step.

According to the present invention with such a constitution, since a chamfering step is effected after a simultaneous double-side surface-grinding step, a wafer which has been flattened in the simultaneous double-side surface-grinding step with the result of a smaller thickness variation and waviness in the wafer is subjected to chamfering and thereby, the intrinsic accuracy of a chamfering machine can be exerted and the wafer with the peripheral portion stabilized in chamfer shapes can be attained.

Besides, by performing simultaneous double-side grinding, waviness on both sides, front and rear, can be eliminated and waviness produced in slicing which would be remained problematic in flattening by single side grinding can also be removed. Furthermore, an etching step can also be omitted by using a high-numbered grinding stone after the chamfering step.

BRIEF DESCRIPTION OF THE DRAWINGS

FIG. 4 is a table showing results of evaluation of a quality of chamfered portion and a waviness of a wafer obtained in examples of the present invention and comparative examples thereof.

The marks shown in the figures respectively indicate in such a manner: 1 for a wafer, 4 for a chamfered portion, E for a slicing step, F for a chamfering step, G1 for a primary simultaneous double-side surface-grinding, G2 for a secondary grinding step, and K for a mirror-polishing step.

DETAILED DESCRIPTION OF THE PREFERRED EMBODIMENT

Below, embodiments of the present invention will illustratively be described with reference to the accompanying drawings. It is to be understood, however, that description on kinds and relative positions of structural constituents, and the order of various steps and the like in the embodiments is not intended to limit the scope of the present invention thereto, unless specifically described, but provided only as examples for the illustrative purposes.

Figure 1:
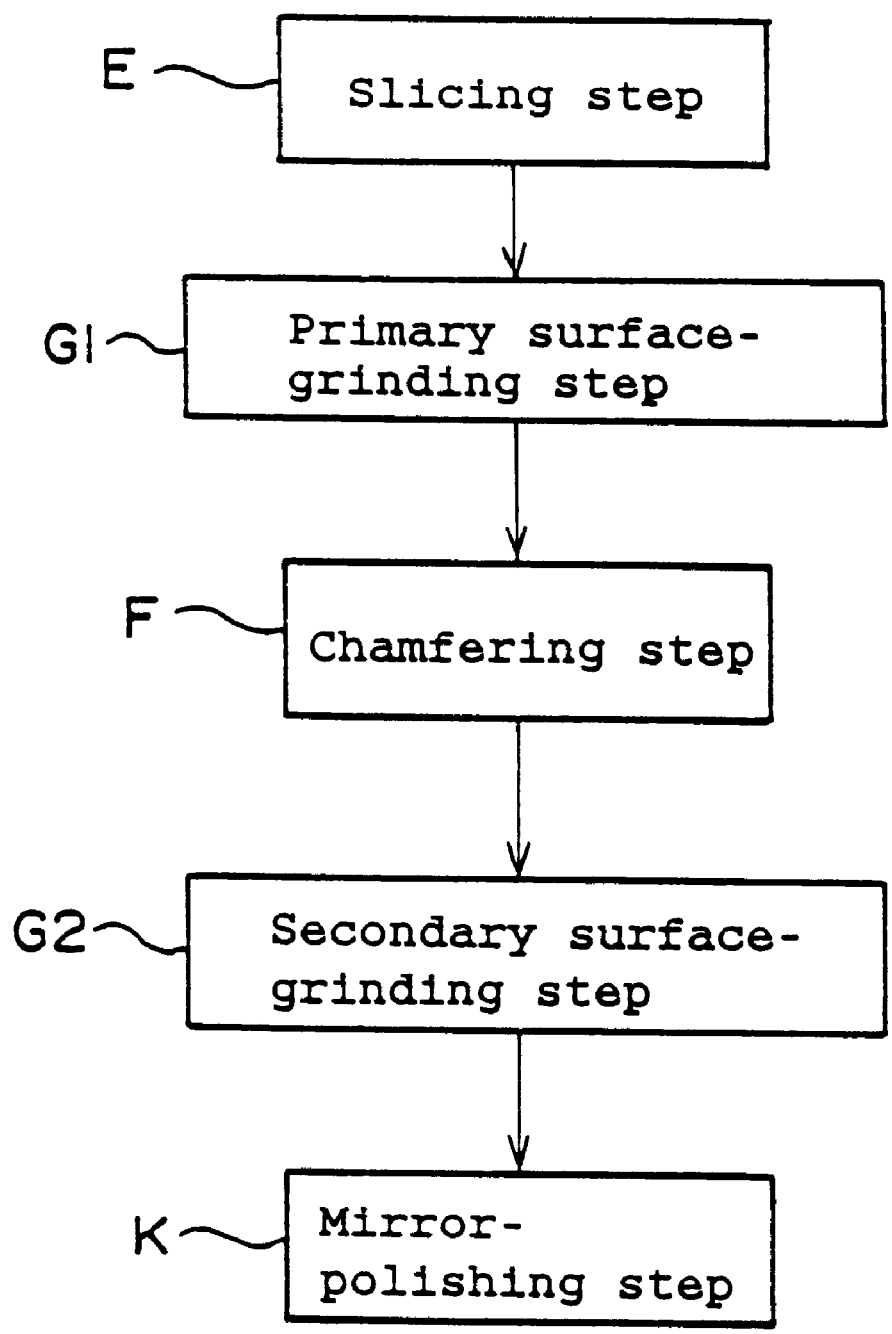
FIG. 1 is a flow chart showing an embodiment of a manufacturing process for a semiconductor wafer of the present invention.

In FIG. 1, a wafer as sliced by a wire saw or an inner diameter blade is flattened by surface-grinding both sides simultaneously in a primary simultaneous double-side surface-grinding step G1. The simultaneous double-side surface-grinding can employ a well known double-side grinding machine. The wafer flattened in the primary simultaneous double-side surface-grinding step G1 is chamfered in a chamfering step F and further subjected to a secondary grinding step G2. Since finishing is performed in this secondary grinding step G2, the etching step H can be eliminated.

Since thickness variations of the wafer and waviness on a surface thereof are removed in the primary simultaneous double-side surface-grinding step G1, no waviness as shown in FIG. 2 arises on the wafer even if the wafer is fixed by single side suction in the secondary grinding step G2. Accordingly, it is effective that an infeed type surface-grinding machine whereby a high flatness can be easily achieved is employed in the secondary grinding step G2. Further, in the secondary grinding step G2 of infeed grinding, single-side grinding is required to be repeated for both surfaces.

In the secondary grinding step G2, a simultaneous double-side grinding with a finish grinding stone may be applied instead of an infeed type surface-grinding machine. In this case, a high-numbered grinding stone for finishing is preferably employed.

A wafer which is processed according to this flow already achieves a high degree of planarization by grinding before being subjected to chamfering and therefore, a high accuracy chamfering can be realized by exerting an accuracy of the chamfering machine itself.

Since the primary simultaneous double-side surface-grinding step G1 is carried out for flattening, stock removal in the grinding is set to be a little more than necessary. Hence, a grinding stone used in the step is of as relatively coarse an abrasive grain as of a size in the range of #600 to #2,000 and of bond material as relatively rigid as metal or vitrified ceramic. Since the secondary grinding step G2 is effected after chamfering, in the grinding, stock removal is small and work damage is weak. For this reason, a grinding stone used in the step is of as relatively fine an abrasive grain as of a size in the range of #2,000 to #8,000 and of bond material as relatively soft as resin or low-level vitrified ceramic. Incidentally, an abrasive grain preferably is of diamond in grinding of either cases.

Further, the chamfering step F may be carried out by an ordinary machine, for example, a chamfering machine of a numerical control type. In the step as well, a two-step chamfering or three or more-step chamfering may be adopted, using grinding stones of as coarse a mesh number as, for example, #600 to #1,000, and of as fine a mesh number, for example, #1,200 to #2,000.

At this point, when the primary grinding is not performed by simultaneous double-side surface-grinding, but is performed while fixing a surface of a wafer by vacuum suction or the like, there arises the following problem.

Figure 2A:
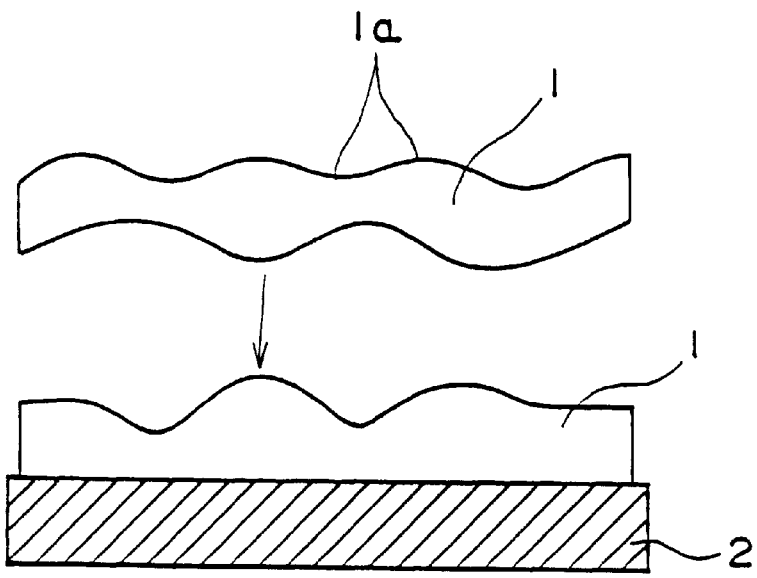
FIGS. 2(A) to 2(C) sectional views illustrating surface-grinding operation by single side vacuum suction.
Figure 2B:
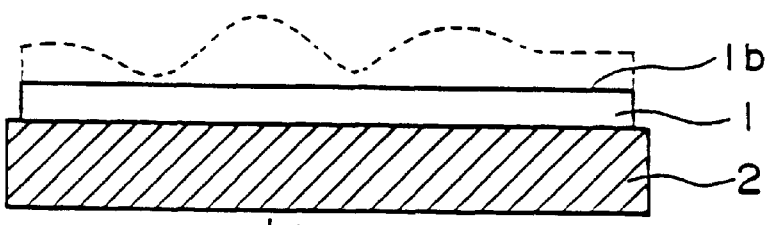
Figure 2C:
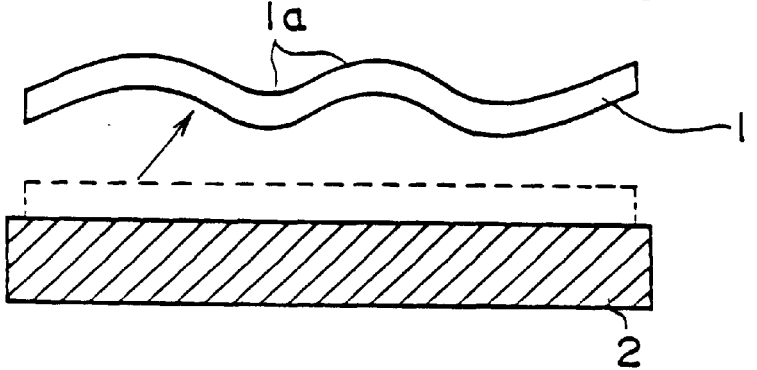

A wafer 1 sliced by a wire saw is inscribed on the surface thereof with minute thickness variations and waviness 1a which occur in company with reciprocating movements of the wire, as shown in FIGS. 2(A) to 2(C) and when the wafer 1 with such irregularities is ground while being fixed on a vacuum type suction table 2 of a surface-grinding machine, the following phenomenon happens.

That is, the wafer 1 with thickness variations and waviness 1a is put into close contact to the suction table 2 with no gap therebetween on the entire surface while being deformed by a vacuum action as shown in FIG. 2(A). When grinding is progressed in this state, the ground surface assumes a flat and smooth surface 1b prior to cancellation of suction as shown in FIG. 2(B), but a shape in a deformed state due to suction restores to the original shape when the suction is canceled, with the result that the thickness variations and waviness 1a are transferred to the ground surface as shown in FIG. 2(C) and thus the wafer is apt to be one with the thickness variations and waviness.

Figure 6:
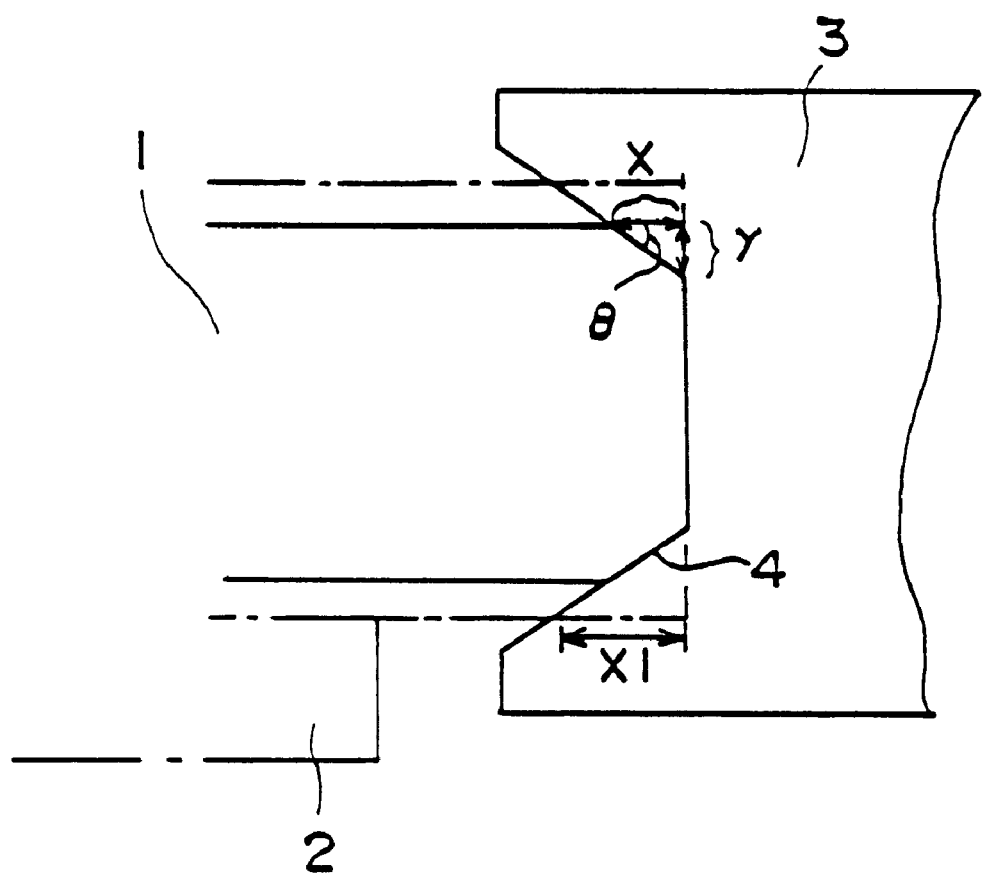
FIG. 6 is a sectional view illustrating a working state of the main parts in chamfering operation.

When the wafer 1 with such thickness variations and waviness is subjected to chamfering, contact points between the peripheral portion of the wafer and the grinding stone are changed as chamfering progresses and therefore, variations of chamfer width occur like the case of the thickness variations described in FIG. 6. Accordingly, in the case of a wafer sliced by a wire saw, grinding with single side suction is not proper but the wafer is preferably ground on both sides simultaneously by a double-side grinding machine. Advantageous points of the simultaneous double-side surface-grinding are that not only can waviness of a wafer be effectively removed, but a processing time is also short since both sides are simultaneously processed.

Figure 3:
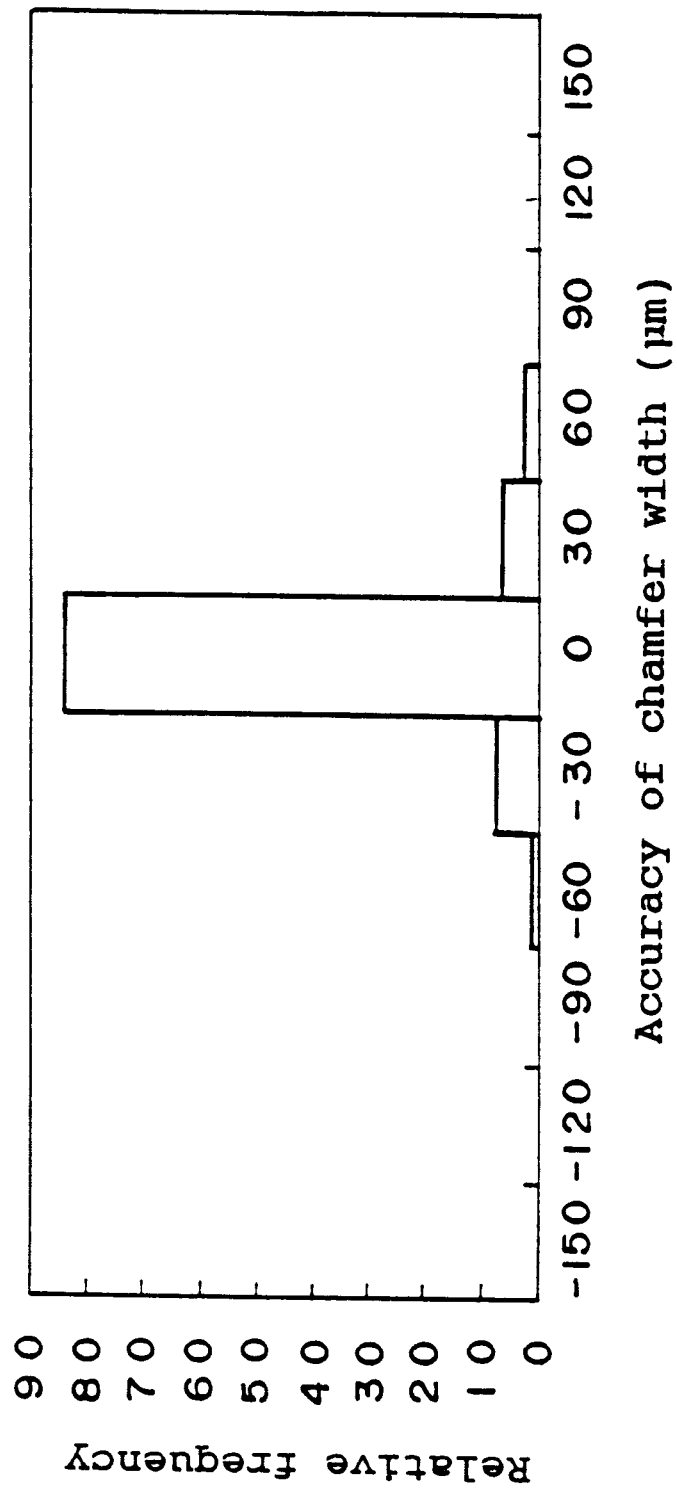
FIG. 3 is a histogram showing values of accuracy of chamfer width of a wafer obtained by a manufacturing process of the presentation.
Figure 7A:
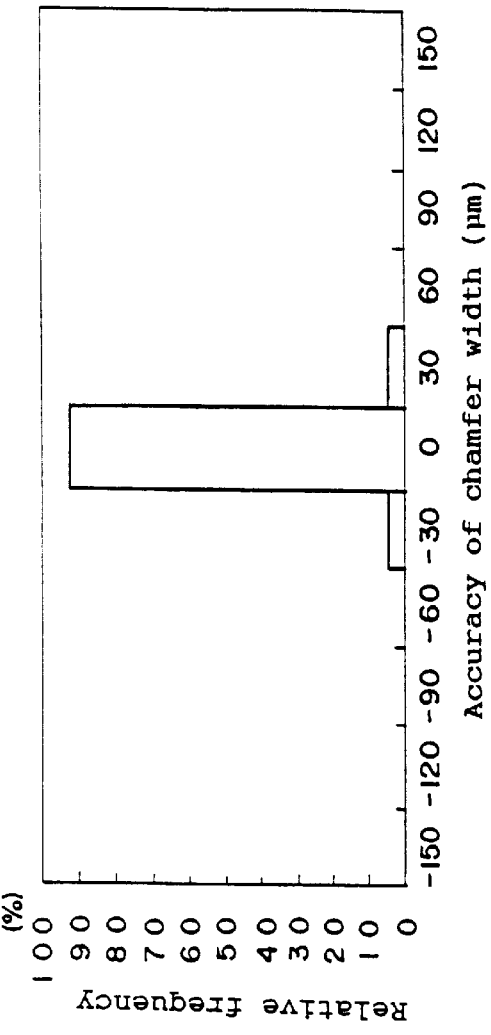
FIG. 7(A) is a histogram showing values of accuracy of chamfer width of an ideal wafer and FIG. 7(B) is a histogram showing values of accuracy of chamfer of a wafer obtained by a conventional manufacturing process.
Figure 7B:
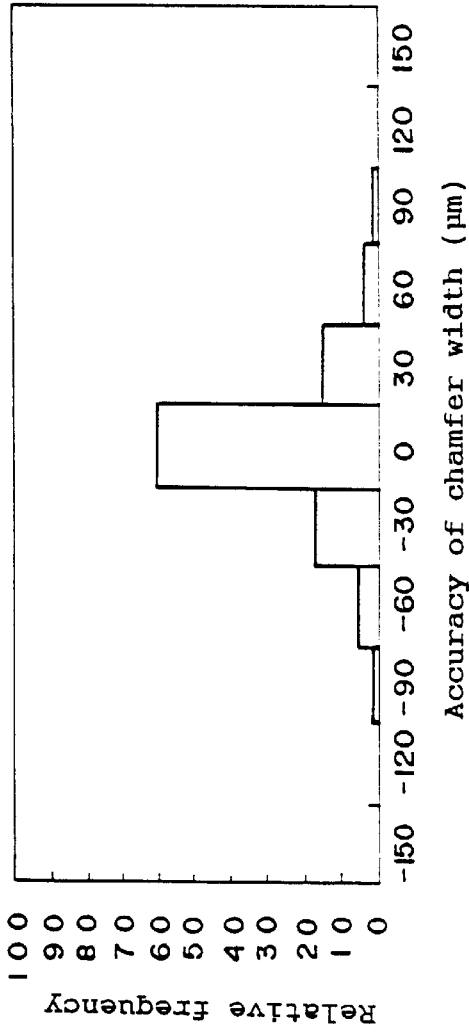

Results of measurements on variations of chamfer width when a chamfering step according to a process of the present invention was performed are shown in FIG. 3. FIG. 3 shows a histogram in which the abscissa is assigned to an accuracy of chamfer width (a chamfer width aberration) and the ordinate is assigned to a relative frequency. In the mean time, an evaluation method for the chamfer width accuracy is similar to a conventional method shown in FIG. 7(B). As clearly seen from the histogram, in the present invention, almost the same values of an accuracy of chamfer width as the values of an accuracy (see FIG. 7(A)) when an ideal wafer is processed were obtained.

Processings of wafers were performed by means of combinations of various processing machines and qualities of chamfer portion and wafer waviness were evaluated on processed wafers.

EXAMPLE 1

Primary simultaneous double-side surface-grinding: vitrified bond #2,000

Secondary grinding: resin bond #2,000

The secondary grinding was carried out on both surfaces.

Wafers which had been sliced by a wire saw were subjected to simultaneous double-side surface-grinding (primary simultaneous double-side surface-grinding) by a double-side grinding machine for planarization, thereafter chamfered, further finished by surface-grinding (secondary grinding) of an infeed type with a cup-shaped grinding stone while being fixed by single side suction and lastly, mirror-polished.

EXAMPLE 2

Primary simultaneous double-side surface-grinding: vitrified bond #2,000

Secondary grinding: resin bond #2,000

Wafers which had been sliced by a wire saw were subjected to simultaneous double-side surface-grinding (primary simultaneous double-side surface-grinding) by a double-side surface grinding machine for planarization, thereafter chamfered, further finished by simultaneous double-side grinding (secondary grinding) with a finish grinding stone with finer abrasive grains and lastly, mirror-polished.

For the comparison purpose, comparative examples in each of which processing according a conventional method was performed were evaluated. Incidentally, not only examples but also comparative examples about two-step grinding with stones of #800 and #1,500 grain sizes, using a numerically controlled chamfering machine.

Comparative Example 1

Lap: #1,200

Figure 5:
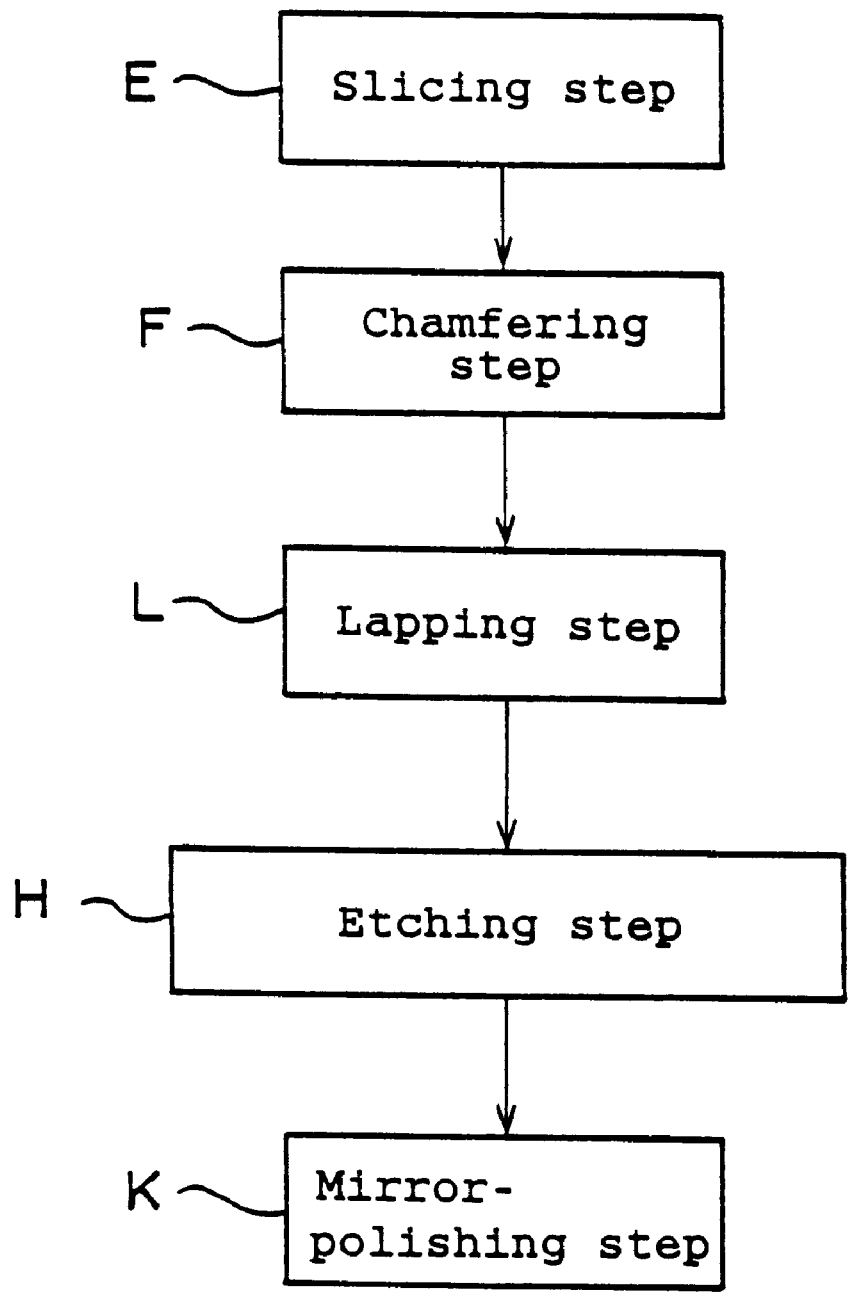
FIG. 5 is a flow chart of a conventional manufacturing process of a semiconductor wafer.

Etching: 40 μm on both sides removed by a mixed acid of hydrofluoric acid and nitric acid Wafers which had been sliced by an inner diameter blade were chamfered, then flattened by lapping, further etched and lastly mirror-polished (a conventional method of FIG. 5).

Comparative Example 2

Surface-grinding: vitrified bond #2,000

Etching: 40 μm on both sides removed by a mixed acid of hydrofluoric acid and nitric acid Wafers which had been sliced by an inner diameter blade were chamfered, then ground to be flattened by a surface-grinding machine with single-side vacuum suction, further etched and lastly mirror-polished.

Comparative Example 3

Surface-grinding: vitrified bond #2,000

Etching: 40 μm on both sides removed by a mixed acid of hydrofluorlc acid and nitric acid Wafers which had been sliced by a wire saw were chamfered, then ground to be flattened by a surface-grinding machine with single-side vacuum suction, further etched and lastly mirror-polished.

Results of evaluation (a quality of chamfering portion and wafer waviness) in the examples and the comparative examples are shown in FIG. 4. A wafer waviness was judged by visual inspection of the wafer. In FIG. 4, the term quality of chamfered portion is an evaluation of a chamfer width accuracy distribution and ⊙ is a case close to FIG. 7(A) and Δ indicates a case close to FIG. 7(B). With respect to a wafer waviness, ⊙ is sufficiently good, ○ good, Δ insufficient but can be used and X insufficient and cannot be used.

As clearly seen from the above evaluation results, the examples 1, 2 show that a quality of chamfer portion and a wafer waviness of each are both sufficiently good. But the comparative examples 1 to 3 show that all qualities of chamfering portion are judged insufficient.

To sum up, as clearly seen from the above detailed embodiments, according to the present invention, since a chamfering step is carried out after at least one run of a simultaneous double-side surface-grinding step, chamfering is performed on a wafer which has been flattened by a simultaneous double-side surface-grinding step, and thereby, a thickness variation and waviness of which are smaller. Hence, the intrinsic mechanical accuracy of a chamfering machine is exerted and a chamfered wafer with the peripheral portion stabilized in chamfer shapes is attained. By performing the secondary grinding of single-side grinding such as infeed grinding or the like, or simultaneous double-side grinding with a finish grinding stone, not only can an etching step eliminated, but a conventional chamfering machine can also be used only with a change of the order or contents of the processing steps, and therefore, a wafer with high accuracy can be obtained at a low cost.

In addition, while apparatuses which are used in the present invention can be any apparatuses on the market as far as a desired processing performance and capacity can be attained, it is preferred that a primary grinding used double-side grinding machine, a chamfering machine, a secondary grinding used infeed surface-grinding machine or a secondary use infeed double-side grinding machine are properly arranged and wafers are automatically transported between machines.

Further, cleaning steps or various kinds of added-value steps may properly be inserted between the steps of the present invention and in the case as well, it is preferred that wafers are automatically transported between machines.

What is claimed is:

1. A manufacturing process of a semiconductor wafer comprising: a slicing step of obtaining a wafer in a shape of a thin disk by slicing a single crystal ingot; a surface-grinding step of flattening a surface of the wafer; a chamfering step of chamfering peripheral edge portions of the wafer; and a mirror-polishing step of mirror-polishing the surface of the wafer, wherein the surface-grinding step comprises a double-side surface-grinding step of grinding both sides of the wafer simultaneously with a double-side grinding machine prior to the chamfering step; and a secondary grinding step is performed by infeed type single-side grinding using a cup-shaped grinding stone after the chamfering step is carried out following the double-side surface-grinding step.

2. A manufacturing process of a semiconductor wafer comprising: a slicing step of obtaining a wafer in a shape of thin disk by slicing a single crystal ingot; a surface-grinding step of flattening a surface of the wafer; a chamfering step of chamfering peripheral edge portions of the wafer; and a mirror-polishing step of mirror-polishing the surface of the wafer, wherein the surface-grinding step comprises a double-side surface-grinding step of grinding both sides of the wafer simultaneously with a double-side grinding machine prior to the chamfering step; and a secondary grinding step is performed by grinding both sides of the wafer simultaneously using a finish grinding stone after the chamfering step is carried out following the double-side surface-grinding step.

3. A manufacturing process of a semiconductor wafer comprising: a slicing step of obtaining a set of wafer s in shapes of thin disk s by slicing a single crystal ingot; a surface-grinding step of flattening surfaces of the set of wafers; a chamfering step of chamfering peripheral edge portions of the set of wafers; and a mirror-polishing step of mirror-polishing the surfaces of the set of wafers, wherein thickness of the set of the wafers is made uniform by a double-side surface-grinding step of grinding both sides of the wafer simultaneously with a double-side grinding machine prior to the chamfering step; and a secondary grinding step is performed by infeed type single-side grinding using a cup-shaped grinding stone after the chamfering step is carried out following the double-side surface-grinding step so as to obtain a set of wafers having small variation with regard to chamfer width values.

4. A manufacturing process of a semiconductor wafer comprising: a slicing step of obtaining a set of wafers in shapes of thin disks by slicing a single crystal ingot; a surface-grinding step of flattening a surface of the set of wafers; a chamfering step of chamfering peripheral edge portions of the set of wafers; and a mirror-polishing step of mirror-polishing the surface of the set of wafers, wherein thickness of the set of the wafers is made uniform by a double-side surface-grinding step of grinding both sides of the wafer simultaneously with a double-side grinding machine prior to the chamfering step; and a secondary grinding step is performed by grinding both sides of the wafer simultaneously using a finish grinding stone after the chamfering step is carried out following the double-side surface-grinding step so as to obtain a set of wafers having small variation with regard to chamfer width values.

* * * * *